(12) United States Patent
Shen et al.

(10) Patent No.: US 8,742,008 B2
(45) Date of Patent: Jun. 3, 2014

(54) PROCESS FOR PREPARING SILOXANE-BASED COMPOSITIONS AND DERIVATIVE COMPOSITIONS THEREOF

(75) Inventors: Qionghua Shen, Latham, NY (US); Walter J. Sherwood, Jr., Clifton Park, NY (US); Christopher K. Whitmarsh, Niskayuna, NY (US)

(73) Assignee: Starfire Systems, Inc., Malta, NY (US)

( * ) Notice: Subject to any disclaimer, the term of this patent is extended or adjusted under 35 U.S.C. 154(b) by 0 days.

(21) Appl. No.: 12/440,603

(22) PCT Filed: Sep. 18, 2007

(86) PCT No.: PCT/US2007/078770
§ 371 (c)(1),
(2), (4) Date: Mar. 10, 2009

(87) PCT Pub. No.: WO2008/036662
PCT Pub. Date: Mar. 27, 2008

(65) Prior Publication Data
US 2009/0275695 A1    Nov. 5, 2009

Related U.S. Application Data

(60) Provisional application No. 60/845,353, filed on Sep. 18, 2006, provisional application No. 60/886,444, filed on Jan. 24, 2007.

(51) Int. Cl.
*C08L 83/00* (2006.01)
*C08L 83/04* (2006.01)

(52) U.S. Cl.
USPC ........... 524/588; 525/477; 525/478; 525/479; 528/15; 528/31; 528/32

(58) Field of Classification Search
USPC ............ 524/588; 525/477, 478, 479; 528/15, 528/31, 32
See application file for complete search history.

(56) References Cited

U.S. PATENT DOCUMENTS

| | | | | |
|---|---|---|---|---|
| 2,870,120 A | * | 1/1959 | Yusem | 528/20 |
| 3,146,218 A | * | 8/1964 | Clark et al. | 528/34 |
| 3,706,755 A | * | 12/1972 | Edenhofer et al. | 546/340 |
| 3,706,775 A | * | 12/1972 | Edenhofer et al. | 556/450 |
| 4,426,480 A | | 1/1984 | Petty | |
| 5,635,240 A | * | 6/1997 | Haluska et al. | 427/180 |
| 5,753,751 A | * | 5/1998 | Liao et al. | 524/837 |
| 5,789,460 A | * | 8/1998 | Harkness et al. | 522/148 |
| 6,384,172 B1 | | 5/2002 | Dvornic et al. | |
| 2001/0033026 A1 | | 10/2001 | Nakata et al. | |
| 2002/0086598 A1 | * | 7/2002 | Velpari et al. | 442/74 |
| 2006/0264583 A1 | * | 11/2006 | Kashiwagi et al. | 525/478 |

FOREIGN PATENT DOCUMENTS

| | | |
|---|---|---|
| DE | 10141599 A1 | 3/2002 |
| JP | 58-018606 A | 2/1983 |
| JP | 19810117484 | 2/1983 |
| JP | 02-124769 A | 5/1990 |
| JP | 02-129070 A | 5/1990 |
| JP | 10-195386 A | 7/1998 |
| JP | 2004-140220 A | 5/2004 |
| JP | 2005-179681 A | 7/2005 |
| KR | 10-2009-7008037 | 11/2013 |

OTHER PUBLICATIONS

Bao et al, British Ceramic Proceedings, 62(2001):1-16.*
Bao et al, British Ceramic Proceedings, 62(2002):1-16.*
Matloka, "Chemistry of Latent Reactive Polycarbosilane/ Polycarbosiloxane Elastomers Via Acyclic Diene Metathesis (ADMET) Polymerization," XP-002517999, A Thesis Presented to the Graduate School of the University of Florida in Partial Fulfillment of the Requirements for the Degree of Master of Science, University of Florida, 2004.
Feb. 12, 2013 Japanese Office Action, which is enclosed without an English Translation, that issued in Japanese Patent Application No. 2009-529345.

* cited by examiner

*Primary Examiner* — Randy Gulakowski
*Assistant Examiner* — Lindsay Nelson
(74) *Attorney, Agent, or Firm* — Evan Law Group LLC

(57) ABSTRACT

A process for forming a new group of siloxane-based compositions by a one-step co-hydrolysis and the compositions formed thereof. The siloxane-based compositions being functionalized with a carbon-carbon double (C=C) bond and a silicon-hydrogen (Si—H) bond. The C=C bond and hydrogen (H) each being attached directly to a silicon (Si) atom of the silicon-oxygen (Si—O) backbone of the siloxane-based composition. The C=C bond may be from a vinyl or an aromatic radical like a phenyl substituent. The C=C bond substituent provides the functionality needed for forming crosslinkages through standard dehydrocoupling catalysts without the need for siloxane fluids or organic compounds containing alkyl or aryl functional groups. The process provides for varying proportions of silanes as starting monomers to tailor the desired silicon, carbon, hydrogen and oxygen ratios in the siloxane-based compositions or resins. The siloxane-based compositions may be used as precursors or replacement resins in the fabrication of other materials.

36 Claims, No Drawings

PROCESS FOR PREPARING SILOXANE-BASED COMPOSITIONS AND DERIVATIVE COMPOSITIONS THEREOF

RELATED APPLICATION

The present application claims the benefit of co-pending provisional application No. 60/845,353, filed on Sep. 18, 2006 and co-pending provisional application No. 60/886,444 filed on Jan. 24, 2007, which are incorporated herein. The present invention is also related to corresponding PCT application entitled "Process For Preparing Silicon Oxycarbide Compositions And Derivative Compositions Thereof", designated with attorney docket, STAR-0015PCT.

BACKGROUND

1. Field of the Disclosure

The disclosure relates to siloxane-based compositions, and more particular to a process of preparing siloxane-base compositions to form intermediate temperature plastic-like materials (from room temperature to 500° C.) and the use of the same as precursors polymers to form high temperature ceramics upon curing and glasses upon pyrolysis.

2. Related Art

In the current state of the art, siloxane-based compositions are used to prepare pre-ceramic polymer compositions, which are used as precursor resins in the preparation of ceramics and glasses. Most precursor resins may be categorized under one of two categories. Category one primarily includes silicone-like siloxanes, for example, methylsiloxanes. Category two primarily includes siloxanes with silicon-hydrogen (Si—H) bond coupled to either a carbon-carbon double (C=C) bond or a carbon-carbon triple (C≡C) bond of an organic compound. While these precursor resins produce good high temperature ceramic materials, they fall short in a number of areas as precursors.

For example, methysiloxanes as precursor resins under category one need to be pyrolyzed to form resins with desirable properties before they can be used in the preparation of ceramics or glasses. Methylsiloxanes, which are usually solids, require a solvent before they can be used in the preparation of pre-ceramic polymers. This presents an additional process step of dissolving the methylsiloxanes in an appropriate solvent in the preparation process. In addition, methylsiloxanes produce low strength, low modulus materials with poor tear strength when cured below pyrolysis temperatures.

Category two precursor resins, for example, resins with an empirical formula, $SiC_xO_y$, require relatively expensive starting materials. Starting materials with C=C bond, for example, divinyl benzene, dicyclopentadiene and butadiene may be hazardous to the environment. In addition, the use of these starting materials results in precursor resins, which require careful storage to ensure a stable shelf-life adding to storage costs. A further limitation of using such starting materials is having these starting materials as residue in any preparation process, which prevents the use of the materials in an open production environment.

In addition, category two precursor resins are limited in the extent to which modifications of their composition may be made. This restricts their application to being, at best, ceramic-forming polymers only.

Siloxane-based compositions may be used to produce UV curable resins for coating papers. Some precursor resins may be formulated in such a way as to produce stable glasses when pyrolyzed at high temperature where the final ceramic is devoid of carbon-oxygen (C—O) bonds.

Siloxane oligomers may be used as coupling agents, adhesion promoters, and adhesives in filled and unfilled organic polymers as wire and cable coatings and adhesives.

SUMMARY

In one aspect, the invention comprises a process for forming a new group of siloxane-based compositions by a one-step co-hydrolysis and the compositions formed thereby. The siloxane-based compositions are functionalized with a carbon-carbon double (C=C) bond and a silicon-hydrogen (Si—H) bond. The C=C bond and hydrogen (H) each being attached directly to a silicon (Si) atom of the silicon-oxygen (Si—O) backbone of the siloxane-based composition. The C=C bond may be from a vinyl or an aromatic radical like a phenyl substituent. The C=C bond substituent provides the functionality needed for forming crosslinkages through standard dehydrocoupling catalysts without the need for siloxane fluids or organic compounds containing alkyl or aryl functional groups. The process provides for varying proportions of silanes as starting monomers to tailor the desired silicon, carbon, hydrogen and oxygen ratios in the siloxane-based compositions or resins. The siloxane-based compositions may be used as precursors or replacement resins in the fabrication of other materials.

A first aspect of the disclosure provides a siloxane-based resin having a composition comprising a copolymer of at least 2 comonomers, wherein: each of the at least 2 comonomers includes a silicon-oxygen (Si—O) bond; each of the at least 2 comonomers includes a silicon-carbon (Si—C) bond; the at least 2 comonomers share a variable proportional relationship; each of the at least 2 comonomers includes a functional group selected from the group consisting of: phenyl, vinyl, methyl and hydrogen; wherein the functional group is attached directly to the silicon (Si) atom of the Si—O bond.

A second aspect of the disclosure provides a process for preparing a siloxane-based composition comprising: mixing three types of dihalosilanes in a one-step co-hydrolysis reaction in the presence of a water-solvent mixture, the solvent being selected from the group consisting of: hexane, tetrahydrofuran (THF), toluene, xylene and any combination of two or more thereof, wherein each of the three types of dihalosilanes comprises of a silicon-oxygen (Si—O) bond for forming a Si—O backbone therebetween; wherein each of the three types of dihalosilanes comprises of at least one silicon-carbon (Si—C) bond; wherein one of the three types of dihalosilanes comprises of a vinyl attached directly to the Si atom of the Si—O bond; wherein one of the three types of dihalosilanes comprises of a hydrogen (H) attached directly to the Si atom of the Si—O bond; wherein one of the three types of dihalosilanes comprises of a phenyl (Ph) attached directly to the Si atom of the Si—O bond; wherein the three types of dihalosilanes share a variable proportional relationship, $x+y+z=1$, $0 \leq x \leq 1$, $0 \leq y \leq 1$, $0 \leq z \leq 1$; wherein x represents the proportion of the type of dihalosilane with a phenyl; wherein y represents the proportion of the type of dihalosilane with a vinyl; and wherein z represents the proportion of the type of dihalosilane with a hydrogen.

A third aspect of the disclosure provides a process of preparing a hybrid copolymer, the hybrid copolymer comprising a silicon-oxygen (Si—O) backbone siloxane-based polymer cross-linked with a silicon-carbon (Si—C) backbone polycarbosilane polymer, the method comprising: adding a highly branched polycarbosilane to a silioxane-based polymer, the polycarbosilane comprising: at least one silicon-hydrogen (Si—H) substitutent, wherein the hydrogen is a monovalent hydrogen bonded directly to a silicon (Si) atom of the Si—C backbone of the polycarbosilane; and at least one carbon-carbon double bond (C═C) substituent, and the siloxane-based polymer having a composition comprising: at least two comonomers, wherein one of the at least two comonomers includes a vinyl substituent; wherein one of the at least 2 comonomers includes a monovalent hydrogen bonded directly to a silicon (Si) atom of the Si—O backbone; and wherein one of the at least 2 comonomers includes a phenyl substituent; reacting the vinyl substituent of the siloxane-based polymer with the monovalent hydrogen atom in the Si—H bond in the polycarbosilane to form an intermediate hybrid copolymer; and curing the intermediate hybrid copolymer by heating the intermediate hybrid copolymer for reacting the C═C substituent in the polycarbosilane with the monovalent hydrogen in the siloxane-based polymer.

DETAILED DESCRIPTION

A process for forming a siloxane-based polymer, alternatively and hereinafter referred to as siloxane-based resin, using a one-step co-hydrolysis reaction is disclosed. The siloxane-based resin may be a copolymer including a minimum of two distinct comonomers or monomeric species. The comonomers link-up to form a silicon-hydrogen (Si—O) backbone of the siloxane-based resin. The Si—O backbone may include functional substituents including, for example, but not limited to, a carbon-carbon double (C═C) bond from a vinyl, an aromatic ring from a phenyl or both; and a monovalent hydrogen from a silicon-hydrogen (Si—H) bond. The each functional substituent is attached directly to a distinct silicon (Si) atom in the silicon-oxygen (Si—O) backbone of the siloxane-based resin. The C═C bond may also be part of, for example, but is not limited to, an allyl group. The C═C bond and aromatic ring substituents provides the functionality for forming cross-linkages through standard dehydrocoupling catalysts.

The simple one-step co-hydrolysis may be a reaction between readily available low cost starting materials, for example, but not limited to vinyl-methyldichlorosilane and methyldichlorosilane to produce two-comonomer siloxane-based resins; or diphenyldichlorosilane, vinyl-methyldichlorosilane and methyldichlorosilane to produce three-comonomer siloxane-based resins. The siloxane-based resins are synthesized using low cost commercially available bulk chlorosilane compounds. The siloxane-based resins are low to medium viscosity liquids, they are non-flammable and will not burn or support combustion after curing above 160° C. In addition, the siloxane-based resins have a low vapor pressure and little odor at room temperature. The process provides control over the composition of siloxane-based resins so prepared, and thus the properties of the siloxane-based resin, by simply altering the ratio of the reactants.

The siloxane-based resin, having a basic copolymer unit, may be represented by general formula I:—

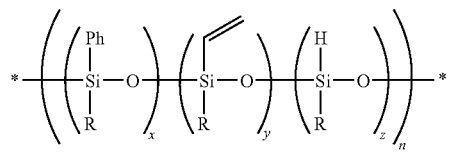

where x+y+z=1, 0≤x≤1, 0≤y≤1, 0≤z≤1;

R, R' and R" are the same or different and are hydrogen (H), methyl, vinyl or phenyl; and
n indicates the number of basic copolymer units in the siloxane-based resin,
1≤n≤600
provided, however, that the monomeric units,

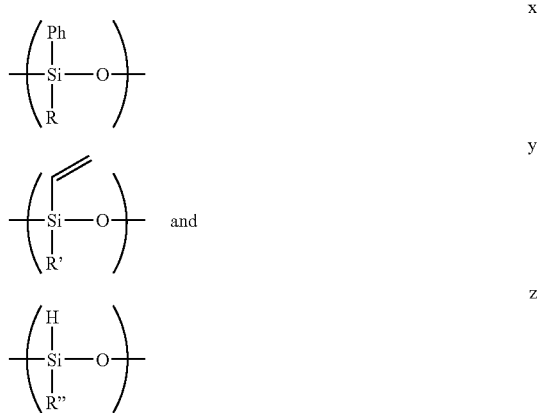

can be arranged in any order. For example, e.g., x-y-x-z-z-y-z-x-z, x-y-y-y-z-y-x-y-y-z-x, y-y-z-z-x-x-y-y, etc. The siloxane-based resins may be cyclic or non-cyclic. The non-cyclic siloxane-based resins include hydroxyl groups as terminals. The cyclic siloxane-based resins open up during cross linking. With the proportion of each of the three comonomers, represented by x, y and z, being variable, the siloxane-based resin may include a 2-comonomer siloxane-based resin or a 3-comonomer siloxane-based resin. The siloxane-based resins may have a molecular weight ranging from approximately 450 to approximately 250,000. Various embodiments of two-comonomers and three-comonomers siloxane-based resins are discussed in the following paragraphs.

Three-comonomers Siloxane-based Resins

In one embodiment, a family of siloxane-based resins having three-comonomers is represented by the general formula I:—

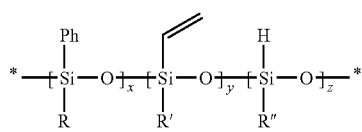

where,
R may include one of the following: phenyl, methyl, hydrogen, or vinyl, preferably, phenyl or methyl;
R' may include one of the following: methyl, vinyl, phenyl, or hydrogen, preferably, vinyl or methyl;
R" may include one of the following: methyl, phenyl, vinyl, or hydrogen, preferably, hydrogen or methyl; and
x+y+z=approximately 1 (or approximately 100%),
x may range from approximately 0.05 to approximately 0.80 (or from approximately 5% to approximately 80%);
y may range from approximately 0.05 to approximately 0.50 (or from approximately 5% to approximately 50%);
z may range from approximately 0.05 to approximately 0.80 (or from approximately 5% to approximately 80%).
For example, the respective values of x, y and z may be, but are not limited to, values as shown in the table below:—

| x | 0.33 | 0.1 | 0.5 | 0.1 | 0.2 |
| y | 0.33 | 0.4 | 0.2 | 0.3 | 0.4 |
| z | 0.33 | 0.5 | 0.3 | 0.6 | 0.4 |

In addition to the respective values in the above table, other structures/compositions or variations of the ratio of x:y:z within the range described above are also considered part of this disclosure for a three-comonomers siloxane-based resin.

The three-comonomers siloxane-based resins, have a silicon-oxygen (Si—O) backbone. The three-comonomers siloxane-based resins may be prepared by the co-hydrolysis of, for example, but not limited to, diphenyldichlorosilane, vinylmethyldichlorosilane and methyldichlorosilane as shown in Equation 1 below:—

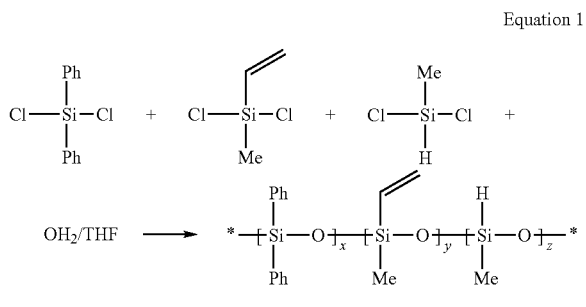

Equation 1

Further discussion of the preparation of this three-comonomers siloxane-based resin is discussed in Synthesis Example 5 later in this disclosure.

Two-comonomers Siloxane-based Resins

In another embodiment of the siloxane-based resins, a family of two-comonomers siloxane-based resins may be derived from the general formula I, with either one of x, y or z=0. In the case where x=0, the two-comonomers siloxane-based resins may be represented by a general formula II:—

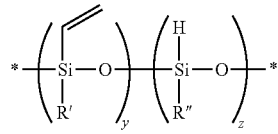

II where,
$0 \leq y \leq 1, 0 \leq z \leq 1$. Preparation of the two-comonomers siloxane-based resin may be by co-hydrolysis of a vinyl dihalo organosilane and a dihalo organosilane.

In the case where y=0, the two-comonomers siloxane-based resin may be represented by a general formula III:—

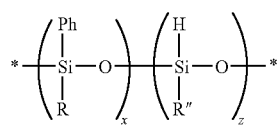

III where,
$0 \leq x \leq 1, 0 \leq z \leq 1$. Preparation of the two-comonomers siloxane-based resin may be by co-hydrolysis of a phenyl dihalo organosilane and a dihalo organosilane.

In the case where z=0, the two-comonomers siloxane-based resin may be represented by a general formula IV:—

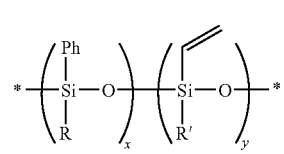

IV where,
$0 \leq x \leq 1, 0 \leq y \leq 1$. Preparation of the two-comonomers siloxane-based resin may be by co-hydrolysis of a phenyl dihalo organosilane and a vinyl dihalo organosilane.

In one example, the two-comonomers siloxane-based resin of general Formula II may be prepared by co-hydrolysis of an alkyldihalosilane and a vinyl alkyldihalosilane. Preparation of an example of one such two-comonomers siloxane-based resin, where R' and R" are a methyl groups, is shown in Equation 2 below.

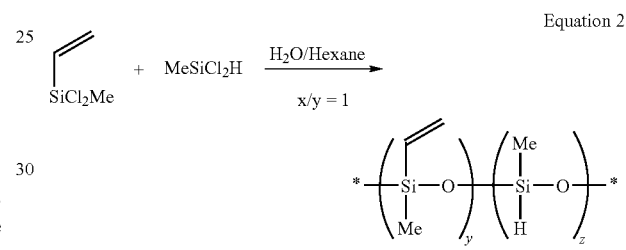

Equation 2

Vinylmethyldichlorosilane and methyldichlorosilane are mixed in the presence of water and hexane. The silane-base resin obtained in Equation 2 is a clear liquid with little discernable odor having low viscosity ranging from approximately 80 cps to approximately 300 cps. The polymer may be cured at temperature ranging from approximately 21° C. to approximately 300° C. in 24 hours with the addition of a platinum complex at a concentration ranging from approximately 1 ppm to approximately 20 ppm. Alternatively, the siloxane-based resin may be cured at approximately 155° C. in approximately 10 minutes with the addition of a complex-type platinum catalyst at a concentration ranging from approximately 10 ppm to approximately 50 ppm.

Useful formulations of the two-comonomers siloxane-based resin may be prepared by varying the proportional relationships (i.e., the ratio of x:y, y:z or x:z) between the distinct comonomers. In the example from Equation 2 above, each of the two-comonomers has one of the substituents: Vinyl or —H. Different ratios of Vinyl: —H in the polymer alters the curing and pyrolysis behavior in addition to the mechanical, thermal and oxidative stability of hard cured (usually at approximately 500° C.) or pyrolyzed ceramic. The proportional relationship between the two distinct comonomers each one having a Vinyl substituent or a —H substituent may be represented by the ratio, y:z, which may range from approximately 1:1 to approximately 1:10. The two-comonomers siloxane-based resin prepared within this ratio range may be prolyzed under an inert gas at a temperature ranging from approximately 500° C. to approximately 1200° C. The following paragraphs discuss some examples of the formulations obtained by varying the ratio of starting comonomers for preparing a two-comonomer siloxane-based resin represented by the general Formula II.

With a ratio of Vinyl:—H at y:z=1:1, a very stiff but tough Lexan-like plastic after curing to a temperature of only approximately 160° C. is obtained. The siloxane-based resin obtained from this formulation may be used as a laminating resin for circuit board and packaging applications requiring lower cure temperatures due to the use of aramid or other organic fiber materials. Preparation of a two-comonomers siloxane-based resin of such ratio proportions, designated as F81, is discussed in Synthesis Example 1 below.

For proportional relationship between Si—H and vinyl at a ratio of y:z=1:4, a pre-ceramic polymer with a 94% yield is obtained when directly heated at approximately 1° C./minute to approximately 510° C. and held for approximately 4 hours. Alternatively, a yield of greater than approximately 85% of the pre-ceramic polymer is obtained when heated at approximately 900° C. The pyrolyzed ceramic exhibits less than approximately 1% mass loss when the most rigorous temperature, also know as "pesting temperature" for silica forming ceramics, at approximately 800° C. in air is applied for approximately 100 hours. The pre-ceramic is comparable to crystalline silicon carbide and also to the black glasses described in existing art. Preparation of a two-comonomers siloxane-based resin of such ratio proportions, designated F82, is discussed in corresponding Synthesis Example 2 below.

Using the ratio of y:z=1:3, for the Vinyl:—H, a pre-ceramic resin is obtained. This pre-ceramic resin cures in minutes at approximately 155° C. and further cures at approximately 510° C. to form a stiff Lexan-like "plastic" at a yield of greater than 95%. This formulation can be used as a high temperature resin to replace polyimide in some applications. Preparation of a two-comonomers siloxane-based resin of such ratio proportions, designated as F83, is discussed in Synthesis Example 3 below.

For a ratio of y:z=1:2 for Vinyl:—H, a very stiff but tough Lexan-like "plastic" is produced after heating at approximately 1° C./minute to a hard cure temperature of approximately 350° C. Following further heating of the Lexan-like "plastic" to approximately 510° C. for approximately 4 hours, a very hard but tough resin with a yield of greater than 97% by mass is obtained. This formulation can be used as a high temperature resin to replace polyimide in some applications. Preparation of a two-comonomers siloxane-based resin of such ratio proportions, designated as F84, is discussed in Synthesis Example 4 below.

In addition to the above formulations, other ratios of Vinyl:—H groups may be formulated within the scope of the disclosure to prepare siloxane-base resins of different properties. For example, Vinyl:—H ratios of greater than 1:2.5 (i.e., 1:3 and 1:4) produce resins/materials that behave more like siloxanes or silicones. These resins/materials exhibit lower strengths at low cure temperatures, but produce very hard, oxidation resistant glass/ceramics when processed at temperatures at or greater than approximately 500° C. These polymers may be used to replace the currently known more expensive black-glass-type polymers having an empirical formula, $SiC_xO_y$.

Resins/materials obtained from Vinyl:—H ratios of less than 1:2.5 (i.e., 1:2 and 1:1) usually exhibit plastic-like or organic-like characteristics. Curing at a temperature ranging from approximately 160° C. to 500° C. produces resins/materials with high stiffness, high toughness and intermediate to high strengths. These materials are potential replacements for the very expensive high temperature organic resins such as PMR-15, Polyamide/imides such as Torlon®, and polytetrafluoroethylene (PTFE) materials.

The high vinyl content resins/materials (i.e., when Vinyl:—H is less than 1:3) have also been demonstrated to functionally replace organic vinyl containing crosslinking additives such as divinyl benzene and 4-vinyl-1 cyclohexene. Since these resins/materials are completely non-flammable/non-combustible, or not as flammable as the organic materials such as vinyl esters, they are advantageous over such other currently used flame resistant organic materials.

SYNTHESIS EXAMPLES OF
TWO-COMONOMERS SILOXANE-BASED
RESINS

Synthesis Example 1

Comonomers with Ratio of 1:1 (F81)

600 g of water was charged in a three-necked round-bottom flask equipped with a magnetic stirrer and an addition funnel. Approximately 120 g of methyldichlorosilane, approximately 141 g of vinylmethyldichlorosilane, and approximately 120 g of hexane were mixed in the addition funnel. The silane mixture was added slowly to the stirred water. The water solution became acidic due to the hydrolysis of the chlorosilanes. Temperature of the water went up gradually with the addition of silanes. The silanes were added within one hour. The resultant reaction mixture was stirred for approximately 2 hours. Then the organic phase was separated, washed by water and dried over sodium sulphate ($Na_2SO_4$). The solvent hexane was removed by distillation. Approximately 139 g of oil product was obtained. Gel Permeation Chromatography (GPC) analysis indicated that the resultant polymer exhibits a bi-modal distribution pattern having a molecular weight (Mw) of approximately 72684 and a molecular number (Mn) of approximately 24469.

Synthesis Example 2

Comonomers with a Ratio of 1:4 (for F82)

Approximately 600 g of water was charged in a three-necked round-bottom flask equipped with a magnetic stirrer and an addition funnel. Approximately 230 g of methyldichlorosilane, approximately 70.5 g of vinylmethyldichlorosilane, approximately 40 g of tetrahydrofuran (THF), and approximately 120 g of hexane were mixed in the addition funnel. The silane mixture was added slowly to the stirred water. The water solution became acidic due to the hydrolysis of the chlorosilanes. Temperature of the water went up gradually with the addition of silanes. The silanes were added within one hour. The resultant reaction mixture was stirred for approximately 2 hours. Then the organic phase was separated, washed by water and dried over $Na_2SO_4$. The solvent hexane was removed by distillation. Approximately 141 g of oil product was obtained. Gel Permeation Chromatography (GPC) analysis indicated that the resultant polymer exhibits a bi-modal distribution pattern having a molecular number (Mn) of approximately 18670.

Synthesis Example 3

Comonomers with a Ratio of 1:3 (for F83)

Approximately 600 g of water was charged in a three-necked round-bottom flask equipped with a magnetic stirrer and an addition funnel. Approximately 207 g of methyldichlorosilane, approximately 84.6 g of vinylmethyldichlorosilane, approximately 30 g of tetrahydrofuran (THF), and approximately 120 g of hexane were mixed in the addition funnel. The silane mixture was added slowly to the stirred water. The water solution became acidic due to the hydrolysis of the chlorosilanes. Temperature of the water went up gradually with the addition of silanes. The silanes were added within one hour. The resultant reaction mixture was stirred for approximately 2 hours. Then the organic phase was separated, washed by water and dried over $Na_2SO_4$. The solvent hexane was removed by distillation. Approximately 128 g of oil product was obtained. Gel Permeation Chromatography (GPC) analysis indicated that the resultant polymer exhibits a bi-modal distribution pattern having a molecular number (Mn) of approximately 24670.

Synthesis Example 4

Comonomers with a Ratio of 1:2 (for F84)

Approximately 600 g of water was charged in a three-necked round-bottom flask equipped with a magnetic stirrer and an addition funnel. Approximately 230 g of methyldichlorosilane, approximately 141 g of vinylmethyldichlorosilane, approximately 30 g of tetrahydrofuran (THF), and approximately 140 g of hexane were mixed in the addition funnel. The silane mixture was added slowly to the stirred water. The water solution became acidic due to the hydrolysis of the chlorosilanes. Temperature of the water went up gradually with the addition of silanes. The silanes were added within one hour. The resultant reaction mixture was stirred for approximately 2 hours. Then the organic phase was separated, washed by water and dried over $Na_2SO_4$. The solvent hexane was removed by distillation. Approximately 151 g of oil product was obtained. GPC analysis indicated that the resultant polymer showed a bi-modal distribution pattern having a molecular weight (Mw) of approximately 65532, and a molecular number (Mn) of approximately 24469.

Synthesis Examples of Three-Comonomers Siloxane-Based Resins

Synthesis Example 5

Synthetic Process for Diphenylvinylmethyl Polysilaoxanes

A mixture of approximately 50 g of tetrahydrofuran and approximately 400 g of water was charged in a three-necked round-bottom flask equipped with a magnetic stirrer and an addition funnel. Approximately 126 g of diphenyldichlorosilane, approximately 38 g of methyldichlorosilane, approximately 47 g of vinylmethyldichlorosilane, and approximately 100 g of toluene, were mixed in the addition funnel. The silane mixture was added slowly to the stirred water. The water solution became acidic due to the hydrolysis of the chlorosilanes. Temperature of the water went up gradually with the addition of silanes. The silanes were added within one hour. The resultant reaction mixture was stirred overnight at room temperature. Then the organic phase was separated, washed by water and dried over sodium sulphate $Na_2SO_4$. The solvents were removed by distillation. Approximately 139 g of viscous liquid was obtained. Gel Permeation Chromatography (GPC) analysis indicated that the resultant polymer has a molecular weight, Mw of approximately 1590 and a molecular number, Mn of approximately 820.

Examples of Applications of Two- and Three-comonomers Siloxane-based Resins

Application Example 1

High Stiffness Packaging and Circuit Board Material

Approximately 0.5 grams of a platinum catalyst complex solution in toluene is added to approximately 150 grams of the resin of Synthesis Example 4 and the solution is stirred for approximately 10 minutes. The catalyzed resin is applied and distributed onto 8 sheets of Style 2113 E-glass cloth of 12.5× 12.5 inch dimensions. The sheets are stacked up to make an 8 layer plate. The plate is placed onto a Teflon® (Teflon is a trademark of E.I. Du Pont De Nemours and Company Corp. in the United States and/or other countries), polytetrafluoroethylene coated paper sheet and another sheet is applied over the last layer of cloth. The assembly is place into a heated platen press set at approximately 160° C., and heated at approximately 1 degree C./minute to approximately 250° C. held for approximately 1 hour. Once cooled, the plate is removed from the press and the paper is removed to leave an approximately 0.5 mm thick glass/composite plate. The plate is then placed in an inert gas furnace oven. The oven is heated at approximately 1 degree C. per minute to approximately 350 deg. C. and held for approximately 0.5 hours. Once cool, the plate is reinfiltrated under a vacuum with the same resin and heated again in the oven to approximately 350° C. A dense, light weight, glass/resin plate with a dielectric constant of around 3 and a dielectric loss factor of 0.002 or lower results.

Fumed silica or submicron silica powder can be added to the resin in the above example to further increase the stiffness and decrease the thermal expansion coefficient and potentially eliminate the need for reinfiltration and pyrolysis.

Application Example 2

Friction Modifying Resin for Pre-formed Friction Materials or Brake Pad Materials Conventional high performance disk brake pads are heated to a temperature of approximately 800° C. to approximately 850° C. for approximately 2 hours to stabilize the structure. Once cool, the pads are infiltrated with a solution of approximately 80% of the resin described in Synthesis Example 3 in a non-polar solvent such as hexane by immersing the pads in the resin under vacuum for approximately ½ hour. The pads are then placed into an inert gas furnace and heated at approximately 1° C./minute to approximately 750° C. to approximately 850° C. depending on the hardness required. The process is repeated until the mass gain of the pad relative to the pre-infiltrated mass reach a percentage of approximately 2% to approximately 5% depending on the performance desired. The brake pad so treated is then capable of being used with ceramic and ceramic composite rotors without producing excessive noise or rotor wear.

The resin described in Synthesis Example 2 may also be used if a harder pad material is required to decrease pad wear against a harder ceramic rotor.

Alternatively, the resin described in Synthesis Examples 2 or 3 could be directly mixed into the brake pad formula prior to forming the pad and pressed into a brake pad using conventional processing.

Application Example 3

Low K, Low Loss, Surface Smoothing Coating for Ceramic and Composite Substrates Approximately 95 g of the intermediate resin described in Synthesis Example 5 is mixed with approximately 5 g of the polymer described in Synthesis Example 1 and stirred using a magnetic stirrer for approximately 10 minutes. Dicumyl peroxide is added at a concentration of 1.5% of the total resin mass or approximately 100 g. The catalyzed resin is further stirred for approximately 10 minutes. The resin is then painted or spin-coated onto a ceramic (alumina) matrix or composite (glass/ceramic, or carbon/ceramic) board intended for use as an electronic board or other substrate. The board is coated slowly in the presence of nitrogen from approximately 21° C. with increment in temperature at a rate of approximately ½° C./minute until a temperature of approximately 300° C. is reached. Alternatively, the board is coated slowly in air at a temperature of approximately 150° C. and held for approximately 1 hour. The coated board is then heated in nitrogen at approximately 1° C./minute to approximately 300° C. to approximately 350° C. and held for approximately ½ hour to approximately 1 hour to allow the coating to harden. The substrate can be recoated if necessary or simply polished to achieve a mirror finish.

Reinforcements/fillers such as ceramic powders (of a fineness in the micron/submicron range) or glass fiber papers can be used to assist in forming thicker coatings if needed. Increasing the resin solids concentration will also result in a thicker coating.

Application Example 4

Low Cost, Thermally Stable High Temperature Ceramic Matrix Composite

Approximately 5 g of 0.1% platinum complex catalyst in toluene is added to a flask containing approximately 1000 g of the polymer obtained from Synthesis Example 2 and mixed with a magnetic stirrer for approximately 15 minutes. Then approximately 1300 g of silicon carbide powder with a size range from approximately 0.5 µm to approximately 4 µm and the catalyzed polymer are charged into a 10-liter ball mill with zirconia milling media and milled for approximately 4 hours to mix the resin and the powders. After approximately 4 hours, approximately 5 g of dicumyl peroxide catalyst is added to the slurry and milled for another hour to mix in the catalyst. Once mixed, the slurry is coated onto 9 plies of carbon fiber fabric of 13-inch by 13-inch dimensions using a roller to thoroughly saturate the plies. After each ply is coated it is stacked onto the preceding ply and the stack rolled to assure good inter-ply adhesion. Once all 9 layers are coated and stacked, the laminate is placed onto a graphite plate with 0.220-inch spacers at 4 corners of the plate to assure uniform thickness and a second graphite plate is placed on top of the stack. The plate/stack is then placed into an inert gas hot press. The stack is loaded to approximately 100 psi and heated at approximately 1° C./minute to approximately 850° C. to approximately 900° C. and held for approximately 1 hour. After cooling, the plate is vacuum infiltrated with resin from Synthesis Example 2 platinum catalyzed as above. The plate is then placed into an inert gas furnace and heated at approximately 1° C./minute to approximately 850° C. to approximately 1150° C. depending on the hardness required. The process is repeated for approximately 4 cycles to approximately 6 cycles until the mass gain of the plate relative to the pre-infiltrated mass is approximately 2% to approximately 5% depending on the performance desired. The plate is now capable of being machined into its desired form such as a composite brake rotor for motorcycles.

An alternative process for increasing the hardness and wear resistance of the resin may be used by adding a Si—C forming pre-ceramic polymer during one or more of the re-infiltration and pyrolysis cycles.

The density of the liquid resins ranges from approximately 1.02 to approximately 1.3 g/cc depending on phenyl content.

The viscosity of the neat resin can range from approximately 50 cps to approximately 10,000 cps depending on composition. The resins are cured with either platinum complexes, for example, but not limited to, typical "zero-state" platinum catalysts; or peroxide catalysts, for example, but not limited to, dicumyl peroxide.

Cross-linking of Three-monomer Siloxane-based Resin with Highly Branched Polycarbosilane A further embodiment of the disclosure provides a process for adding a highly branched carbosilane polymer to the two or three-comonomers siloxane-based resin to provide improved adhesion, stiffness, and toughness to the materials. The highly branched carbosilane polymer may include an allyl group, a phenyl group, an acetyl group, a propargyl group or a combination thereof. The use of such carbosilanes allows a dual stage curing mechanism, by first having the vinyl group react with the hydrogen (H) to "B-stage" the resin (i.e. form an intermediate resin), followed by curing of the allyl group with hydrogen at a higher temperature to produce a very stiff, tough, "plastic" at low cure temperatures.

The typical ratios of silicon-carbon (Si—C) backbone polymers, alternatively referred to as polycarsbosilanes, to a [three-comonomers] siloxane-based resin with a silicon-oxygen (Si—O) backbone, ranges from approximately 1:20 to approximately 20:1. Interesting properties are demonstrated throughout this ratio range. The vinyl groups in the three-comonomers siloxane-based resin from Synthesis Example 5 react with the silicon bonded hydrogen atoms on the carbosilanes to form an initial "tacky" stage at temperatures from approximately 40° C. to approximately 150° C. while the allyl groups in the carbosilane react with the remaining hydrogen on the silicon-oxygen (Si—O) polymers to produce crosslinking at a temperature as low as approximately 250° C. to produce a rigid "plastic" like solid.

The addition of highly branched polycarbosilanes, containing phenyl, allyl, acetyl and/or propargyl, to the Si—O backbone resins results in a cross-linked hybrid copolymer system/material. The hybrid copolymer system/material may present a range of toughness and high temperature strength when cured at different temperatures. The temperature range may include by is not limited to approximately 180° C. to approximately 500° C. over a period of time, for example, but not limited to, approximately 4 hours. The use of highly branched polycarbosilanes can also provide an actual glass transition temperature (Tg) for the hybrid copolymer system/material. Siloxane-based polymer compositions with Si—O backbone having vinyl crosslinkages, including, for example, but not limited to, the 3-comonomers siloxane-based resins represented by Formula I, are usually pure thermosetting resins.

Examples of highly branched polycarbosilanes are provided below:

073: $[SiMe(\sim)CH(\sim)]_{0.75}n[Si(Ph)HCH_2]_{0.25}n$,
075: $[SiMe(\sim)CH(\sim)]n[SiMe(H)CH_2]n[SiMe(Allyl)CH_2]n$,
086: $[SiMe(\sim)CH(\sim)]_{0.7}n[Si(Ph)HCH_2]_{0.25}n[Si(Ph)AllylCH_2]_{0.05}n$,
092: $[SiMe(\sim)CH(\sim)]_{0.7}n[SiPh_2CH_2]_{0.3}n$, 093: $[SiMe(\sim)CH(\sim)]_{0.7}n[Si(Allyl)_2CH_2]_{0.3}n$,
where: ~ represents the branched chains; and
the coefficient next to the "n" can be varied as needed.

Furthermore, typical polycarbosilanes, for example, but is not limited to,
045: $[SiH_2CH_2]_{0.2}n[Si(Allyl)HCH_2]_{0.2}n[Si(Ph)CH_2]_{0.6}n$
where ~ represents the branched chains; and
the coefficient next to the "n" can be varied as needed
may be used to improve stiffness and toughness at low temperature ranging from approximately 250° C. to approximately 350° C.; and to control adhesion to metals, for example, but not limited to, aluminum and copper. Alternatively, commercially available polycarbosilanes, for example, but not limited to, SMP-10, representative formula: $[SiH_2CH_2]_{0.9n}[SiH(CH_2CH=CH_2)CH_2]_{0.1n}$ and SMP-75, representative formula: $[SiH_2CH_2]_{0.25n}[SiH(CH_2CH=CH_2)CH_2]_{0.75n}$ (both from STARFIRE Systems) and commercially available polysilazanes such as KiON® HTT 1800 (KiON Corporation, Huntingdon Valley, Pa.),) may also be used to achieve the same purpose/result.

Processes for preparing the two-comonomers and the three-comonomers siloxane-based resin provide control of the amount of, and rate of crosslinking to produce a polymer network with desired stiffness, toughness, or flexibility. This may be achieved through the systems illustrated in the foregoing examples by controlling the amount of:

Phenyl groups, which imparts toughness and stiffness, where too much will result in a Tg that is too low, and raise the viscosity of the neat resin too high.

Hydrogen, where too much results in a soft resin that shrinks when heated and has minimal strength and too little results in a very high cure temperature Vinyl groups, where too little results in a soft resin, and too much results in a hard and brittle resin. High vinyl content also produces excess heat during crosslinking.

Allyl groups, which imparts stiffness and a secondary hardening mechanism in addition to the vinyl cure mechanism, where too much allyl will produce too high a stiffness and lead to brittleness.

The above systems can be cured using either platinum (Pt) or peroxide catalysts, for example, but not limited to, dicumyl peroxide. Some of the polymers, prepared according to the above systems yield approximately 94% to approximately 97.5% at a temperature above approximately 500° C. As compared to the ceramic yield of approximately less than 90% at comparable temperatures by currently know systems, such polymers have a very high ceramic yield. This is apparently primarily due to the minimal amount of C=C bonding in products prepared by various methods or aspects of the disclosure compared to prior art.

Application Examples of Allyl, or Allyl/Phenyl Containing Carbosilane Polymer Cross-linked with the Three-monomer Component Resin Application Example 5

High Temperature Capable, Tough, Transparent Hybrid Inorganic/Organic Plastic Like Material Approximately 87 g of polymer obtained from Synthesis Example 5 is mixed with approximately 13 g of 073 branched polycarbosilane in a 200 ml flask using a magnetic stirrer. The mixture is stirred for approximately 10 minutes prior to adding approximately 1 g of dicumyl peroxide and stirring for an additional approximately 10 minutes. Once prepared, approximately 45 g of the polymer is poured into a 13 mm deep 100 mm×100 mm PTFE tray. The PTFE tray is placed into an oven and heated at a temperature increment of approximately 0.5° C./minute up to a temperature of approximately 200° C. and held for approximately 1 hour. The cross-linked polymer and pan are then placed into an inert gas furnace and heated from approximately 21° C. at a temperature increment of approximately 1° C./minute up to a temperature of approximately 250° C. and held for approximately 4 hours. This temperature increment is used for all subsequent steps as well. Solidified resin from the tray are removed and heated to approximately 400° C. and held for approximately 2 hours and finally heated to approximately 500° C. and held for approximately 1 hour. The percentage mass yield is approximately 78% to approximately 84%. The resulting solid, un-cracked disk is orange/brown in color, transparent, and exhibits high stiffness with reasonable toughness, with a density of approximately 1.15 to approximately 1.20 g/cc.

Application Example 6

Producing A Pre-Preg Or Laminate Sheet 20 g of a 0.2% platinum catalyst was added to 1000 g of the resin from Synthesis Example 5 and the catalyzed resin was stirred for 15 minutes. 400 g of submicron silica powder and 150 g of xylene were added to a 4 liter milling jar that contained milling media. The catalyzed resin was then added to the jar and the entire mixture was ball milled for 1 hour. The resulting paint-like fluid was poured into a 12"×4" tray. Six sheets of 10" by 10" Style 2116 E-glass were then dipped and thoroughly coated with the fluid. The sheets were then hung in an oven and B-staged at a temperature range of approximately 160° C. to approximately 170° C. for 3-5 minutes. The resulting coated glass sheets were slightly "tacky". The six coated and B-staged sheets were then used to make a laminate by laying the sheets on a PTFE coated steel sheet and pressing in a platen press set at approximately 150° C. and heating at temperature increment range of approximately 2° C./minute to approximately 5° C./minute under a pressure range of approximately 20 psi to approximately 50 psi to a temperature of approximately 280° C. and holding for approximately 1 hour. Heating to a higher temperature range of approximately 300° C. to approximately 350° C. in inert gas will result in a stiffer but still strong and tough laminate.

Application Example 7

Copper Cladding of a Laminate

Approximately 25 g of the polymer from Synthesis Example 5 is mixed with approximately 5 g of xylene in a 40 ml vial to form a polymer/xylene solution. A two-layer laminate obtained according to the process in Application Example 6, but heated only to approximately 170° C. in inert gas. Once the laminate is cooled to room temperature, a thin layer of the polymer/xylene solution is painted onto one side of the laminate and allowed to air dry at approximately 100° C., the opposite side of the laminate is coated in the same manner and allowed to dry in the same manner. Two pieces of ½ ounce copper foil, each treated on one side, are cut to the size of the laminate. One piece of foil is placed, with treated side up, onto a hard, flat surface. The coated laminate is carefully placed on the foil sheet, with no wrinkles or bubbles formed therebetween. The second piece of foil is then placed, with treated side down, onto the laminate to make a copper-laminate-copper "clad laminate".

A roller is used to make sure there are no bubbles therebetween and to ensure full contact of the foil sheets with the laminate. The assembly is then placed into a platen press and a pressure of approximately 50 psi is applied at a heating rate of approximately 1° C./minute to approximately 275° C. and holding for approximately 2 hours. After the hold, the laminate is allowed to cool slowly at a cooling rate of approximately less than 5° C./miniute to room temperature. The result is an approximately 0.006 inch thick copper clad laminate, with good stiffness and excellent electrical properties.

The foregoing description of various aspects of the disclosure has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A siloxane-based resin consisting of two or three types of copolymer units:

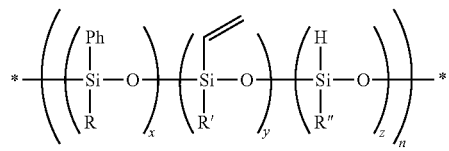

Formula I wherein the variable proportional relationship is represented by $x+y+z=1$, $0 \leq x \leq 1, 0 \leq y \leq 1, 0 \leq z \leq 1$;

wherein n indicates the number of basic copolymer units in the siloxane-based resin, $1 < n < 600$; and wherein each of the R is, independently, a functional group selected from the group consisting of: hydrogen (H), vinyl and phenyl;

wherein R' is, independently, a functional group selected from the group consisting of: hydrogen (H), methyl, vinyl and phenyl; and wherein R" is, independently, a functional group selected from the group consisting of: hydrogen (H), methyl, vinyl and phenyl.

2. The siloxane based resin of claim 1 wherein x ranges from approximately 0.05 to approximately 0.80; wherein y ranges from approximately 0.05 to approximately 0.50; and wherein z ranges from approximately 0.05 to approximately 0.80.

3. The siloxane based resin of claim 2, wherein y and z has a ratio relationship, y:z ranging from approximately 1:1 to approximately 1:10.

4. A process for preparing a siloxane-based composition comprising:
mixing up to three types of dihalosilanes in a one-step co-hydrolysis reaction in the presence of a water-solvent mixture, the solvent being selected from the group consisting of: hexane, tetrahydrofuran (THF), toluene, xylene and any combination of two or more thereof,
wherein a silicon-oxygen (Si—O) bond is formed as a result of co-hydrolysis reaction between the dihalosilanes;
wherein each of the of dihalosilanes comprises at least one silicon carbon (Si—O) bond;
wherein one of the dihalosilanes comprises at least one silicon-carbon (Si—C) bond;
wherein one of the dihalosilanes comprises a vinyl attached directly to the Si atom and a functional group selected form the group consisting of methyl and vinyl attached directly to the Si atom;
wherein one of the dihalosilanes comprises a hydrogen (H) attached directly to the Si atom and a methyl functional group attached directly to the Si atom;
wherein one of the dihalosilanes comprises a phenyl (Ph) attached directly to the Si atom and a functional group selected from the group consisting of: hydrogen (H), vinyl and phenyl attached directly to the Si atom;
wherein the dihalosilanes share a variable proportional relationship, $x+y+z=1$, $0 \leq x \leq 1, 0 \leq y \leq 1, 0 \leq z \leq 1$;

wherein x represents the proportion of the type of dihalosilane with a phenyl;
wherein y represents the proportion of the type of dihalosilane with a vinyl; and
wherein z represents the proportion of the type of dihalosilane with a hydrogen.

5. The process according to claim 4, wherein x=0; wherein y and z are expressed in a ratio proportional relationship, y:z, ranging from approximately 1:1 to approximately 1:10.

6. The process according to claim 4, further comprising pyrolyzing under an inert gas at a temperature ranging from approximately 500° C. to approximately 1200° C.

7. A composition of matter obtained according to the process of claim 6.

8. The process according to claim 4, further comprising curing the composition at a temperature ranging from approximately 21° C. to approximately 300° C. with a catalyst selected from a group consisting of: a platinum complex at a concentration ranging from approximately 1ppm to approximately 20ppm, a peroxide at a concentration ranging from approximately 0.1% to approximately 1% and a combination thereof.

9. The process according to claim 8, wherein the peroxide is dicumyl peroxide.

10. The process according to claim 4, wherein the dihalosilane with a phenyl is dichlorodiphenylsilane.

11. A composition of matter obtained according to the process of claim 10.

12. A process of preparing a hybrid copolymer, the hybrid copolymer comprising a silicon-oxygen (Si—O) backbone siloxane-based polymer cross-linked with a silicon-carbon (Si—C) backbone polycarbosilane polymer, the method comprising:
adding a highly branched polycarbosilane to a silioxane-based polymer,
the polycarbosilane comprising:
at least one silicon-hydrogen (Si—H) substituent, wherein the hydrogen is a monovalent hydrogen bonded directly to a silicon (Si) atom of the Si—C backbone of the polycarbosilane; and
at least one carbon-carbon double bond (C═C) or propargyl substituent, and
the siloxane-based polymer being derived from:

at least two comonomers,
wherein one of the at least two comonomers includes a vinyl substituent;
wherein one of the at least two comonomers includes a monovalent hydrogen bonded directly to a silicon (Si) atom of the Si—O backbone; and
reacting the vinyl substituent of the siloxane-based polymer with the monovalent hydrogen atom in the Si—H bond in the polycarbosilane to form an intermediate hybrid copolymer; and
curing the intermediate hybrid copolymer by heating the intermediate hybrid copolymer for reacting the at least one C=C propargyl substituent in the polycarbosilane with the monovalent hydrogen in the siloxane-based polymer.

13. The process according to claim 12, wherein the at least one C=C substituent of the highly branched polycarbosilane is selected from the group consisting of: an allyl, a phenyl, a vinyl and combinations thereof.

14. The process according to claim 13, wherein the reacting is conducted at a temperature ranging from approximately 40° C. to approximately 150° C.

15. The process according to claim 13, wherein the curing is conducted at approximately 180° C.-250° C.

16. A hybrid copolymer obtained according to the process of claim 15.

17. A composition of matter comprising a siloxane-based resin obtained according to the process of claim 12.

18. A composition of matter comprising a resin derived from a siloxane-based resin obtained according to the process of claim 4.

19. A process for preparing a composition of matter, the process comprising a siloxane-based resin obtained according to the process of claim 4.

20. A wet lay-up laminating resin comprising a siloxane-based resin obtained according to the process of claim 4.

21. A "B-staging" resin comprising a siloxane-based resin obtained according to the process of claim 4.

22. A process for the manufacture of materials for use as electronic packaging, circuit boards and heat sinks, the process comprising adding a composition of matter obtained from the process according to claim 4 to one from a group consisting of: a starting material, an intermediate and a combination thereof.

23. The process for preparing polymers with glass, organic, ceramic, or metallic fillers, the process including adding a composition of matter obtained from the process of claim 4 to one from a group consisting of: a starting material, an intermediate and a combination thereof.

24. A process for the manufacture of substrate surface coatings, dielectric coatings, encapsulants, and sealants, the process comprising adding a composition of matter obtained from the process according to claim 4 to one from a group consisting of: a starting material, an intermediate and a combination thereof.

25. A matrix material comprising a composite from the siloxane based resin of claim 1.

26. A fiber coating to control bonding of a matrix to fibers, to protect fibers, and to improve thermal resistance of fibers, the fiber coating comprising: a siloxane-based composition obtained according to the process of claim 4.

27. A coating on fabrics comprising a siloxane-based resin obtained according to the process of claim 4.

28. A process for preparing wear-resistant materials, the process comprising: reinforcing an intermediate temperature resin with one selected from a group consisting of: carbon, ceramic, glass fiber and powder fillers, wherein the intermediate temperature resin is obtained according to claim 4.

29. A formulation for a coating, the formulation comprising: a siloxane-based resin obtained according to the process of claim 4, wherein the coating is used as one selected from a group consisting of: a hardface coating, a wear coating, a seal coating, a corrosion resistant protective coating and a dielectric coating.

30. A flame retardant additive to existing organic resins comprising a siloxane-based resin obtained according to the process of claim 4.

31. A coating for deposition on glass, organic fiber, inorganic fiber, paper and cloth, the coating comprising a matrix formed from a siloxane-based resin obtained according to the process of claim 4, wherein the matrix is either heat resistant or fire resistant.

32. An additive for replacing any brominated compounds in existing organic resin and for enhancing the heat and flame resistance properties thereof, the additive comprising a siloxane-based resin obtained according to the process of claim 4.

33. A heat resistant panel comprising a siloxane-based resin obtained according to the process of claim 4.

34. A low dielectric constant material for dielectric applications comprising a siloxane-based resin obtained according to the process of claim 4.

35. An additive for replacing a cross vinyl type organic material in a crosslinking additive, a property modification additive and an agent in organic and inorganic fluids, resins and polymers, the additive comprising a siloxane-based resin obtained according to the process of claim 4.

36. A formulation for replacing high temperature resins comprising a siloxane-based resin obtained according to the process of claim 4.

* * * * *

UNITED STATES PATENT AND TRADEMARK OFFICE
CERTIFICATE OF CORRECTION

PATENT NO. : 8,742,008 B2
APPLICATION NO. : 12/440603
DATED : June 3, 2014
INVENTOR(S) : Qionghua Shen et al.

It is certified that error appears in the above-identified patent and that said Letters Patent is hereby corrected as shown below:

Claims

Column 15, line 21-52, replace claim 1 with the following:

1. A siloxane-based resin consisting of two or three types of copolymer units having a general formula:

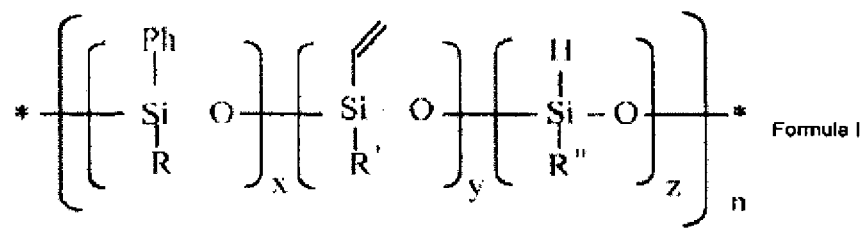

Formula I wherein the variable proportional relationship is represented by
$x + y + z = 1$,
$0 \leq x < 1, 0 < y < 1, 0 < z < 1$;
wherein n indicates the number of basic copolymer units in the siloxane-based resin,
$1 \leq n \leq 600$; and
wherein each of the R is, independently, a functional group selected from the group consisting of: methyl and phenyl;
wherein R' is, independently, a functional group selected from the group consisting of: methyl and vinyl; and
wherein R" is, independently, a functional group selected from the group consisting of: hydrogen (H), and methyl.

Signed and Sealed this
Twenty-third Day of February, 2016

Michelle K. Lee
Director of the United States Patent and Trademark Office

CERTIFICATE OF CORRECTION (continued)
U.S. Pat. No. 8,742,008 B2

Column 15, line 58, please delete "claim 2," and insert --claim 1,--

Column 15, line 61, cancel the text beginning with "4. A process for preparing a siloxane-based composition" to and ending "with a hydrogen." in Column 16, line 30, and insert the following claim:

--4. A process for preparing a siloxane-based composition comprising:

mixing at least two types and up to three types of dihalosilanes in a one-step co-hydrolysis reaction in the presence of a water-solvent mixture, the solvent being selected from the group consisting of: hexane, tetrahydrofuran (THF), toluene, xylene and any combination of two or more thereof;

wherein a silicon-oxygen (Si-O) bond is formed as a result of co-hydrolysis reaction between the dihalosilanes;

wherein each of the dihalosilanes comprises at least one silicon-carbon (Si-C) bond;

wherein one of the dihalosilanes comprises a vinyl attached directly to the Si atom and a functional group selected from the group consisting of methyl and vinyl attached directly to the Si atom;

wherein one of the dihalosilanes comprises a hydrogen (H) attached directly to the Si atom and a methyl functional group attached directly to the Si atom;

wherein one of the dihalosilanes comprises a phenyl (Ph) attached directly to the Si atom and a functional group selected from the group consisting of: hydrogen (H), vinyl and phenyl attached directly to the Si atom;

wherein the dihalosilanes share a variable proportional relationship, $x + y + z = 1$, $0 \leq x < 1, 0 < y < 1, 0 < z < 1$;

wherein x represents the proportion of the type of dihalosilane with a phenyl;

wherein y represents the proportion of the type of dihalosilane with a vinyl; and wherein z represents the proportion of the type of dihalosilane with a hydrogen.--

Column 16, line 42, please delete "from a" and insert --from the--

Column 17, line 13, please delete "C=C propargyl" and insert --C=C or propargyl--

Column 17, line 33, please delete "comprising a" and insert --comprising providing a--

Column 17, line 34, please delete "claim 4." and insert --claim 4 and forming said composition of matter using said siloxane-based resin.--

Column 17, line 37, please delete "B-staging" and insert --B-staged--

CERTIFICATE OF CORRECTION (continued)
U.S. Pat. No. 8,742,008 B2

Column 17, line 42, please delete "one from a group" and insert --one selected from the group--

Column 17, line 45, please delete "The process" and insert --A process--

Column 17, line 48, please delete "one from a group" and insert --one selected from the group--

Column 18, line 2, please delete "one from a group" and insert --one selected from the group--

Column 18, line 5, please delete "from" and insert --including--

Column 18, line 15, please delete "from a group" and insert --from the group--

Column 18, line 17, please delete "claim" and insert --the process of claim--

Column 18, line 20, please delete "selected from a" and insert --selected from the--